United States Patent [19]
Papasouliotis et al.

[11] Patent Number: 6,030,881
[45] Date of Patent: Feb. 29, 2000

[54] HIGH THROUGHPUT CHEMICAL VAPOR DEPOSITION PROCESS CAPABLE OF FILLING HIGH ASPECT RATIO STRUCTURES

[75] Inventors: George D. Papasouliotis, Fishkill; Ashima B. Chakravarti, Hopewell Junction; Richard A. Conti, Mount Cisco; Laertis Economikos, Wappingers Falls, all of N.Y.; Patrick A. Van Cleemput, Sunnyvale, Calif.

[73] Assignees: Novellus Systems, Inc., San Jose, Calif.; International Business Machines Corporation, Armonk, N.Y.

[21] Appl. No.: 09/072,759

[22] Filed: May 5, 1998

[51] Int. Cl.$^7$ .................................................. H01L 21/762
[52] U.S. Cl. ......................... 438/424; 438/435; 438/695; 438/759
[58] Field of Search ..................... 438/424, 427, 438/435, 437, FOR 227, 695, 759

[56] References Cited

U.S. PATENT DOCUMENTS

| | | |
|---|---|---|
| 5,270,264 | 12/1993 | Andideh et al. . |
| 5,494,854 | 2/1996 | Jain . |
| 5,621,241 | 4/1997 | Jain . |
| 5,872,058 | 2/1999 | Van Cleemput et al. . |
| 5,920,792 | 7/1999 | Lin . |
| 5,937,323 | 8/1999 | Orczyk et al. . |

*Primary Examiner*—George Fourson
*Attorney, Agent, or Firm*—Skjerven, Morrill, MacPherson, Franklin & Friel, LLP; Tom Chen

[57] ABSTRACT

A method is provided for filling high aspect ratio gaps without void formation by using a high density plasma (HDP) deposition process with a sequence of deposition and etch steps having varying etch rate-to-deposition rate (etch/dep) ratios. The first step uses an etch/dep ratio less than one to quickly fill the gap. The first step is interrupted before the opening to the gap is closed. The second step uses an etch/dep ratio greater than one to widen the gap. The second step is stopped before corners of the elements forming the gaps are exposed. These steps can be repeated until the aspect ratio of the gap is reduced so that void-free gap-fill is possible. The etch/dep ratio and duration of each step can be optimized for high throughput and high aspect ratio gap-fill capacity.

34 Claims, 6 Drawing Sheets

HIGH THROUGHPUT CHEMICAL VAPOR DEPOSITION PROCESS CAPABLE OF FILLING HIGH ASPECT RATIO STRUCTURES

BACKGROUND OF THE INVENTION

1. Field of the Invention

The present invention relates generally to methods of thin film deposition and, more specifically, to a process of filling high aspect ratio gaps on substrates.

2. Background of the Invention

As semiconductor technology advances, circuit elements and interconnections on wafers or silicon substrates become increasingly more dense. In order to prevent unwanted interactions between these circuit elements, insulator-filled gaps or trenches located therebetween are provided to physically and electrically isolate the elements and conductive lines. However, as circuit densities continue to increase, the widths of these gaps decrease, thereby increasing gap aspect ratios, typically defined as the gap height divided by the gap width. As a result, filling these narrower gaps becomes more difficult, which can lead to unwanted voids and discontinuities in the insulating or gap-fill material.

In previous generations of microelectronic devices the gaps between metal lines were filled using either PECVD (plasma enhanced chemical vapor deposition) processes or the combinations of those with sputter etch steps. For example, U.S. Pat. No. 5,270,264 to Andideh et al., describes a gap-filling process which involves the steps of deposition by PECVD, followed by argon sputter etching, followed by another PECVD deposition step; i.e. a PECVD "dep-etch-dep" process. The article by S. Pennington et al. (hereinafter "the article by Pennington et al."), entitled "An Improved Interlevel Dielectric Process for Submicron Double-Level Metal Products," in *Proceedings of the 6th International IEEE VLSI Multilevel Interconnection Conference,* (1989), pp. 355–359, describes a dielectric gap-filling process using both PECVD and thermal CVD (THCVD). The article by D. Cote et al. (hereinafter "the article by Cote et al."), entitled "Low-Temperature Chemical Vapor Deposition Processes and Dielectrics for Microelectronic Circuit Manufacturing at IBM, in the *IBM Journal of Research and Development,* vol. 39, no. 4, (July 1995), pp. 437–464 describes several known CVD processes, including low pressure (LP), atmospheric pressure (AP) CVD, and plasma-enhanced (PE) CVD, which are background to the present invention. However, the gap-fill capabilities of such processes or combinations of processes do not extend beyond aspect ratios of 1.3:1 at spacing 0.45 $\mu$m or 4500 A, even when "dep-etch-dep" cycles are performed, as described in U.S. Pat. No. 5,270,264 and the article by Cote et al. Specifically, the article by Cote et al. refers to and presents data demonstrating the inability of PECVD processes to satisfy the gap-fill requirements of advanced microelectronic devices with either undoped or doped silica glass.

In the gap-fill process described in U.S. Pat. No. 5,270,264, a step of deposition by PECVD is followed by a sputter etch step with argon and another step of deposition by PECVD. As understood by those skilled in the art, deposition by PECVD is strictly a deposition step, i.e. not involving simultaneous etching during exposure to the depositing plasma. U.S. Pat. No. 5,270,264 describes a gap-filling process which performs a sputter etch using inert gases of heavy atomic weight such as Ar, Kr, and Xe. The process parameters for the PECVD deposition and etching are specified in that patent for the plasma power density and pressure. In addition, the capabilities of the dep-etch-dep processes described in the articles by Pennington et al., by Cote et al., and U.S. Pat. No. 5,270,264 are limited by virtue of the use of PECVD deposition, the selection of sputter gases described therein, and the process parameters defined for the sputter etch step. As a result, the processes described in these references cannot be used to fill gaps having aspect ratios greater than about 2:1 and width less than about 0.65 $\mu$m (6500 angstroms).

High density plasma (HDP) chemical vapor deposition (CVD) processes are currently used to fill gaps having aspect ratios of about 3:1 and having close spacing, e.g. about 0.25 $\mu$m. HDP processes operate at a pressure regime several (two to three) orders of magnitude lower than that of their PECVD counterparts. Moreover, in an HDP reactor, power is coupled inductively to the plasma, resulting in higher plasma density. Consequently, in an HDP reactor, because of the pressure and plasma characteristics, the species impinging on the depositing film surface are much more energetic than in a PECVD reactor, such that gas-solid collisions may result in sputtering of the deposited film. In an HDP CVD deposition process, the sputter etch component is typically between 10 and 20% of the net deposition rate. Another characteristic of HDP deposition is that increased bias power applied to the wafer results in an increased in situ sputter etch component, thereby decreasing the deposition rate.

By contrast, in PECVD reactors the coupling is capacitive, resulting in much lower plasma density. The combination of low plasma density and high pressure results in negligible film sputtering in PECVD deposition. In addition, those skilled in the art will understand that the rate of film deposition in PECVD processes may increase with the amount of bias power applied to the wafer.

The differences in the physics and chemistry of PECVD and HDP processes result in significant differences in the growth of the deposited film. In PECVD processes, plasma is used to generate deposition precursors, which in turn, are driven to the wafer surface by applied bias to the wafer. Because of the relatively high pressure of operation (on the order of 1 Torr) the ions experience a large number of collisions as they cross the sheath. As a result, the flux of deposition precursor species to the wafer surface is distributed. Moreover, the mixture is depleted of deposition precursors as it diffuses towards the bottom of the trench, and, as a result, the net rate of film growth at the bottom of the trench is smaller than that at the entry region of the trench. Therefore, void-free filling of gaps having high aspect ratios (i.e. aspect ratios approaching or exceeding 2:1 at 0.65 $\mu$m spacing) cannot be achieved using PECVD methods since the opening to the gap will be closed long before the gap is filled. For these reasons, the process sequence described in U.S. Pat. No. 5,270,264 of PECVD deposition, argon sputter etch, followed by another PECVD deposition, cannot provide void-free filling of high aspect ratio gaps at current microelectronic dimensions.

Existing HDP deposition processes typically employ chemical vapor deposition (CVD) with a gas mixture containing oxygen, silane, and inert gases, such as argon, to achieve simultaneous dielectric etching and deposition. In an HDP process, RF bias is applied to a wafer substrate in a reaction chamber. As a result, the flux of deposition precursors is perpendicular to the wafer, and the net film growth occurs perpendicularly to the bottom of the feature. Some of the gas molecules (particularly argon) are ionized in the plasma and accelerate toward the wafer surface when the RF bias is applied to the substrate. Material is thereby sputtered when the ions strike the surface. As a result, dielectric material deposited on the wafer surface is simultaneously sputter-etched to help keep gaps open during the deposition process, which allows higher aspect ratio gaps to be filled.

Figure 1A:
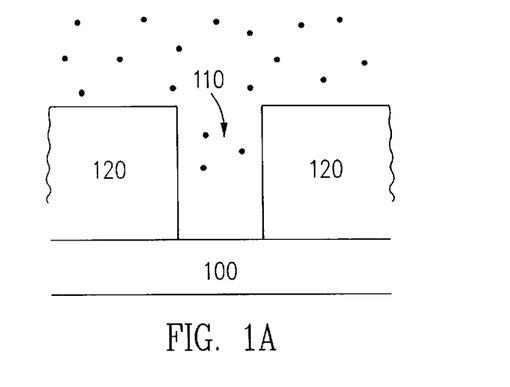
FIGS. 1A–1D are sequential views of a conventional HDP deposition process with optimized etch/dep ratios.
Figure 1B:
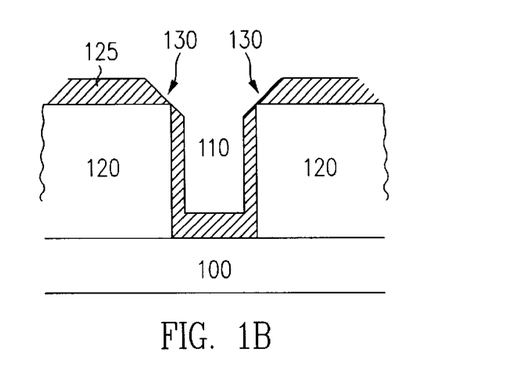
Figure 1C:
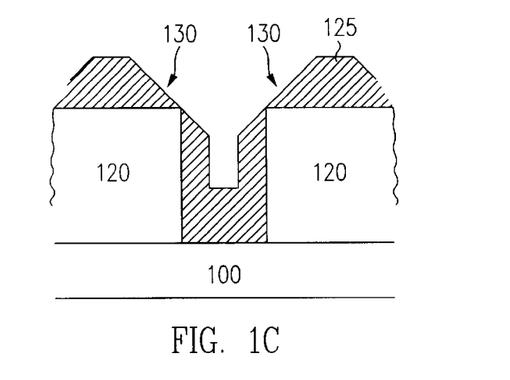
Figure 1D:
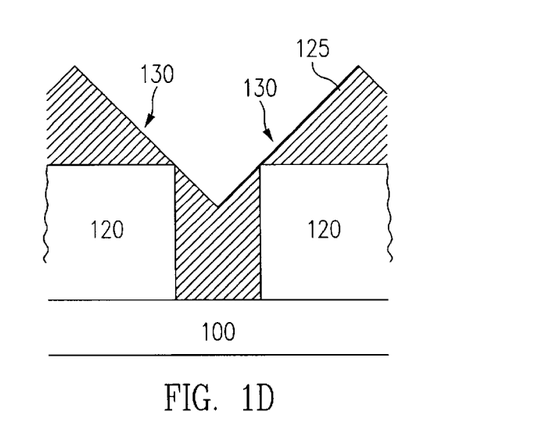

FIGS. 1A–1D illustrate, in more detail, the simultaneous etch and deposition (etch-dep) process described above. In FIG. 1A, a gas mixture of silane ($SiH_4$), oxygen ($O_2$), and an inert gas such as argon (Ar) begins depositing $SiO_2$ on the surface of a wafer 100 for filling a gap 110 between circuit elements 120. As $SiO_2$, formed from the $SiH_4$ and $O_2$, is being deposited, charged Ar and other charged ions impinge on the $SiO_2$ or dielectric layer 125, thereby simultaneously etching the $SiO_2$ layer. However, because the etch rate at about 45° is approximately three to four times that on the horizontal surface, approximately 45° facets 130 form at the corners of elements 120 during the deposition process, as shown in FIG. 1B. FIGS. 1C and 1D show the process continuing to fill gap 110 with simultaneous etching and deposition of $SiO_2$.

Figure 2A:
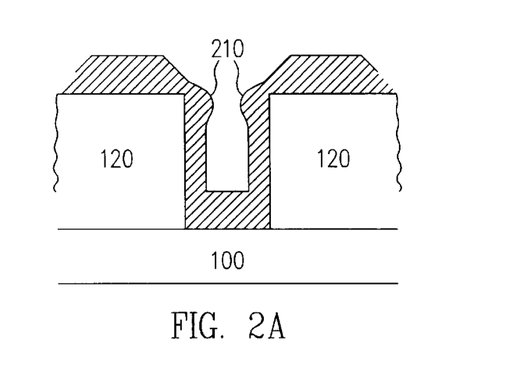
FIGS. 2A–2B are sequential views illustrating void formation when the etch/dep ratio decreases using a conventional HDP process.
Figure 2B:
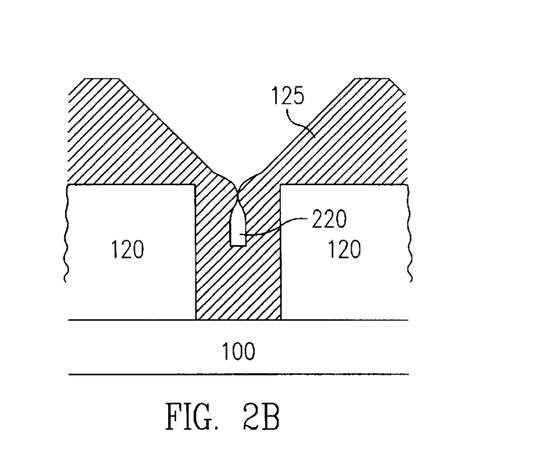

In FIGS. 1A–1D, the etch/dep ratio, defined as the ratio of etch rate to deposition rate, is optimized such that facets 130 remain at the corners of circuit elements 120 throughout the HDP deposition process. However, as shown in FIG. 2A, if the etch/dep ratio is decreased, facets 130 begin moving away from the corners of elements 120, and cusps 210 begin to form around the entry or opening of gap 110. Cusp formation is due in part to some of the etched $SiO_2$ being redeposited on opposing surfaces through line-of-sight redeposition, even though most of the etched $SiO_2$ is emitted back into the plasma and pumped out of the reaction chamber. This redeposition increases as the distance between opposing surfaces decreases. Therefore, as facets 130 move away from the corners of elements 120, the line-of-sight paths are shortened, resulting in increased sidewall redeposition. At a certain point in the process, cusps 210 will meet and prevent further deposition below the cusps. When this occurs, a void 220 is created in dielectric layer 125, as shown in FIG. 2B. Thus, cusp formation creates reentrant features, i.e., the width at the entry to the gap is smaller than the width at the bottom of the gap, which makes void-free gap-filling harder to achieve. The likelihood of creating voids is increased when elements 120 are reentrant before the gap-fill process begins.

Figure 3:
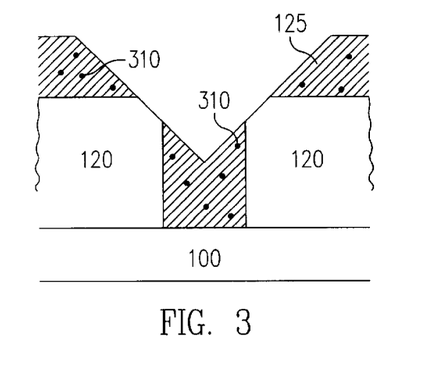
FIG. 3 is a picture of "clipped" corners when the etch/dep ratio increases using conventional HDP processes.

On the other hand, if the etch/dep ratio is increased, as shown in FIG. 3, the etching component can etch or "clip" material from the corners of elements 120, thereby damaging elements 120 and introducing etched contaminants 310 into dielectric layer 125.

Figure 4:
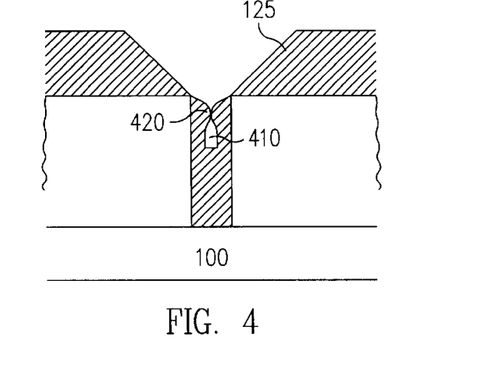
FIG. 4 is a picture of void formation when filling a high aspect ratio gap using a conventional HDP process.

By optimizing the etch/dep ratio, gaps with aspect ratios of up to about 4:1 and widths as low as 0.15 µm can be filled without voids. However, as shown in FIG. 4, filling higher aspect ratio gaps results in voids 410 due to cusps 420 prematurely closing the gaps even if the etch/dep ratio is optimized. As discussed above, this is due mainly to the shortened line-of-sight path between opposing sidewalls. Cusp formation at the entry region of high aspect ratio gaps to be filled cannot be totally eliminated because sputtering and redeposition reactions are inherent to the physics and chemistry of the HDP CVD process. If the etch rate is increased to keep the gaps open longer, undesirable corner clipping can occur.

Therefore, with circuit densities increasing, a method is desired to fill higher aspect ratio gaps and gaps between reentrant elements without the problems discussed above with current HDP deposition processes.

SUMMARY OF THE INVENTION

In accordance with the present invention, a high aspect ratio gap-fill process uses a high density plasma (HDP) deposition process with a sequence of deposition and etching steps having varying etch rate-to-deposition rate (etch/dep) ratios to reduce the aspect ratio during the gap-fill process and prevent the opening of the feature from closing before the gap is filled.

In the first step of the HDP process, gap-fill material is deposited in the gap with a deposition process having an etch/dep ratio of greater than about 0.02. Preferably, for maximizing the gap-fill capability of the process while preventing corner clipping, the deposition step should have an etch/dep which is less than or equal to approximately 0.25. Before the entry to the gap closes, the deposition step is interrupted to prevent void formation within the gap. The point in time when the deposition step is stopped is determined by optimizing the gap-fill capability and throughput of the process. Preferably, the deposition step is stopped when the minimum opening of the gap entry region is no less than 40% of the initial width or opening of the gap. If the deposition step is interrupted prematurely, the overall process will require a higher number of process steps, while interrupting after more than 60% of the initial opening has been closed will compromise the gap-fill capabilities of the process, as explained below.

In the next step, the overhang or cusp is removed by etching. Before the corners of the elements forming the gap are exposed from the etch step, the etch step is stopped to prevent corner clipping. In this step, the etching component is greater than the deposition component (the etch/dep ratio of the process should preferably be higher than 50), thereby opening the entry to the gap. Since the thickness of the material deposited at the entry region of the gap is lower than that at the bottom of the gap, the aspect ratio of the gap at the end of a deposition/etching cycle (deposition step followed by an etch step) is lower than the initial or previous aspect ratio. The deposition and etch steps can be repeated until the resulting aspect ratio is low enough to allow void-free gap-fill with a deposition step or a normal HDP CVD process. In principle, the overall process consists of 2n+1 steps, where n is a positive integer.

The duration and etch/dep ratio of each step can be determined by simulations and experiments to optimize throughput and gap-fill capability. Throughput is further increased because the entire gap-fill process is performed in a single process chamber, instead of separate deposition and etch chambers. Etch/dep ratio is varied and transitions from deposition to etching steps are effected by changing the gas mixture chemical composition, the power supplied to the reactor, the chamber pressure, and/or the wafer temperature.

Accordingly, this invention accomplishes void-free gap-fill for gaps having high aspect ratios (>5:1) and small openings (<0.15 µm) through use of a composite multi-step HDP-CVD process.

This invention will be more fully understood in light of the following detailed description taken together with the accompanying drawings.

BRIEF DESCRIPTION OF THE DRAWINGS

Use of the same reference numbers in different figures indicates similar or like elements.

DETAILED DESCRIPTION

The present invention provides a high density plasma (HDP) process using multiple sequential deposition and etch steps of different etch rate-to-deposition rate (etch/dep) ratios to fill high aspect ratio gaps. Steps with etch/dep ratios less than one (referred to hereinafter as deposition steps) are used to primarily fill the gaps, while etch-dep steps with etch/dep ratios greater than one (referred to hereinafter as etch steps) are used to primarily open up the entries to the gaps.

The following description illustrates the use of undoped silicon oxide (USG) in filling structures of high aspect ratio (>5: 1) and width smaller than 0.15 μm. The shallow trench isolation (STI) step is one example for which the method of the present invention can be implemented. However, the method of the present invention can also be used in other steps in the production of integrated circuits where films are deposited, such as pre-metal dielectric (PMD) and inter-metal dielectric (IMD) films. Depending on the production step, the deposited film can be USG, phosphorus-doped oxide (PSG), fluorine-doped oxide (FSG), boron-doped oxide (BSG), boron/phosphorus doped oxide (BPSG), SiC, amorphous silicon, silicon nitride, or Ge-doped oxide. Those skilled in the art will thus appreciate that the use of dopant sources, such as, but not limited to, phosphine ($PH_3$), silicon tetrafluoride ($SiF_4$), Ge compounds such as tetramethyl and tetraethyl germanium, nitrogen, ammonia, methane, ethylene, acetylene, and $B_2H_6$, for deposition of these other films is within the scope of this invention. Note that these compounds are given as examples. The scope of this invention is not material-specific, but it encompasses any material which can be deposited and etched.

Figure 5A:
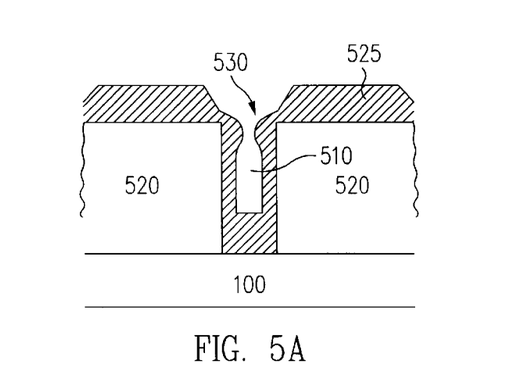
FIGS. 5A–5C are sequential views of high aspect ratio gaps filled with the method of the present invention.
Figure 5B:
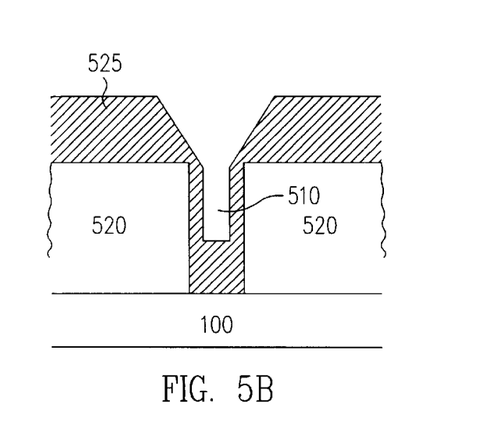
Figure 5C:
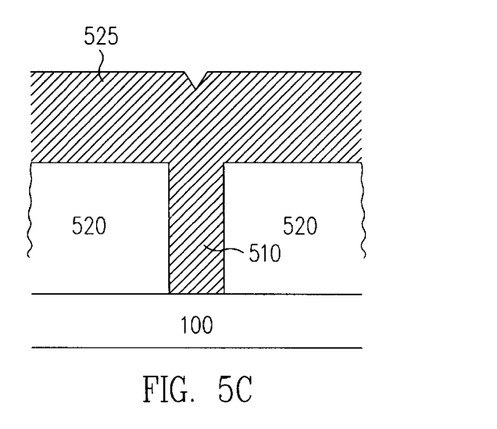

FIGS. 5A–5C show the steps for one embodiment of the present invention for filling a high aspect ratio gap with a $SiO_2$ or dielectric layer 525. In FIG. 5A, high aspect ratio gaps 510 (i.e., typically having aspect ratios greater than 5:1) are formed between circuit elements 520 on a substrate or wafer 100. Circuit elements 520 can include, for example, transistors, conductors, or interconnects. Gap 510 is filled using an HDP process having an etch/dep ratio less than one and preferably higher than 0.02 and less than or equal to 0.25. Cusps 530 begin to form at the corners of circuit elements 520 as $SiO_2$ layer 525 fills gap 510, as shown in FIG. 5A. Before cusps 530 close the entry to gap 510, the deposition step is stopped. Preferably, the deposition step is stopped before the entry to gap 510 is narrowed to 40% of the initial entry opening. After this initial deposition step, gap 510 is partially filled and partially closed.

In FIG. 5B, the next step of the HDP process uses an etch/dep ratio greater than fifty to widen the entry to gap 510. The etch step removes the cusp material 530 and, as a result, the entry to gap 510 is widened. Before the corners of elements 520 are exposed, the etch step is stopped to prevent clipping. Since the thickness of the material deposited at the entry region of the gap is lower than that at the bottom of the gap, the aspect ratio of the gap at the end of the deposition/etching cycle (a deposition step followed by an etch step) is lower than the initial or previous aspect ratio of the feature. The deposition/etching cycle is repeated as many times as necessary until the resulting gap can be filled by a conventional HDP deposition step (FIG. 5A) without void formation, as shown in FIG. 5C. The material deposited during different deposition steps may not be necessarily the same. Deposition of composite structures, including, but not limited to USG/PSG/USG or USG/FSG/USG, in which the overall layer consists of segments having different chemical composition, is within the scope of this invention.

Factors dictating the optimum etch/dep ratio of each deposition step include the aspect ratio of the gaps and the size of the gap openings prior to each deposition step. Data from simulations and experiments can be used to maximize gap-fill process efficiency by varying the etch/dep ratio and deposition step duration according to specific wafer parameters prior to each deposition step. Methods to vary the etch/dep ratio are well-known in the art and include changing the chemical composition of the reactive gas mixture, the power supplied to the wafer, the pressure of the process chamber, and the temperature of the wafer. For example, increasing the HF power to the wafer, reducing the amount of silane in the gas mixture, and increasing the temperature of the wafer are some ways to increase the etch/dep ratio.

The etch/dep ratio is determined through measurements carried out on flat wafers as follows: The deposition rate of the biased film is subtracted from that of the UBUC (unbiased, unclamped) film. Without biasing, no etching component is present. Thus, the etch rate is given by the difference of the two rates. The etch/dep ratio is then given by the ratio of the difference (UBUC deposition rate)–(biased rate) over the UBUC deposition rate.

Table 1 provides typical process parameter ranges for a deposition step to fill a high aspect ratio gap with undoped silica glass. The gas mixture comprises oxygen, silane, and an inert gas, such as Ar or He. Low frequency power (LF) requirements range from 2 kW to 10 kW, and high frequency (HF) power ranges from 0.5 kW to 10 kW, dependent upon the wafer size (200 or 300 mm diameter) and the process being used. The deposition step can be performed in conventional HDP CVD reactors, such as the standard Novellus HDP chamber (SPEED) of Novellus Systems, Inc. of San Jose, Calif. For example, in the Novellus reactor, LF power is applied to the dome of the reactor to create the background plasma, and HF power is applied to the electrostatic chuck (ESC) to attract ionized molecules in the plasma toward the wafer surface for sputtering.

TABLE 1

| PROCESS PARAMETER | RANGE |
|---|---|
| Low Frequency Power (kW) | 2–10 |
| High Frequency Power (kW) | 0.5–10 |
| Chamber Pressure (mTorr) | 1.5–25 |
| Deposition Step Duration (s) | 5–500 |
| Oxygen Flow Rate (sccm) | 10–1000 |
| Inert Gas Flow Rate (sccm) | 10–1000 |
| Silane Flow Rate (sccm) | 10–250 |

Figure 6:
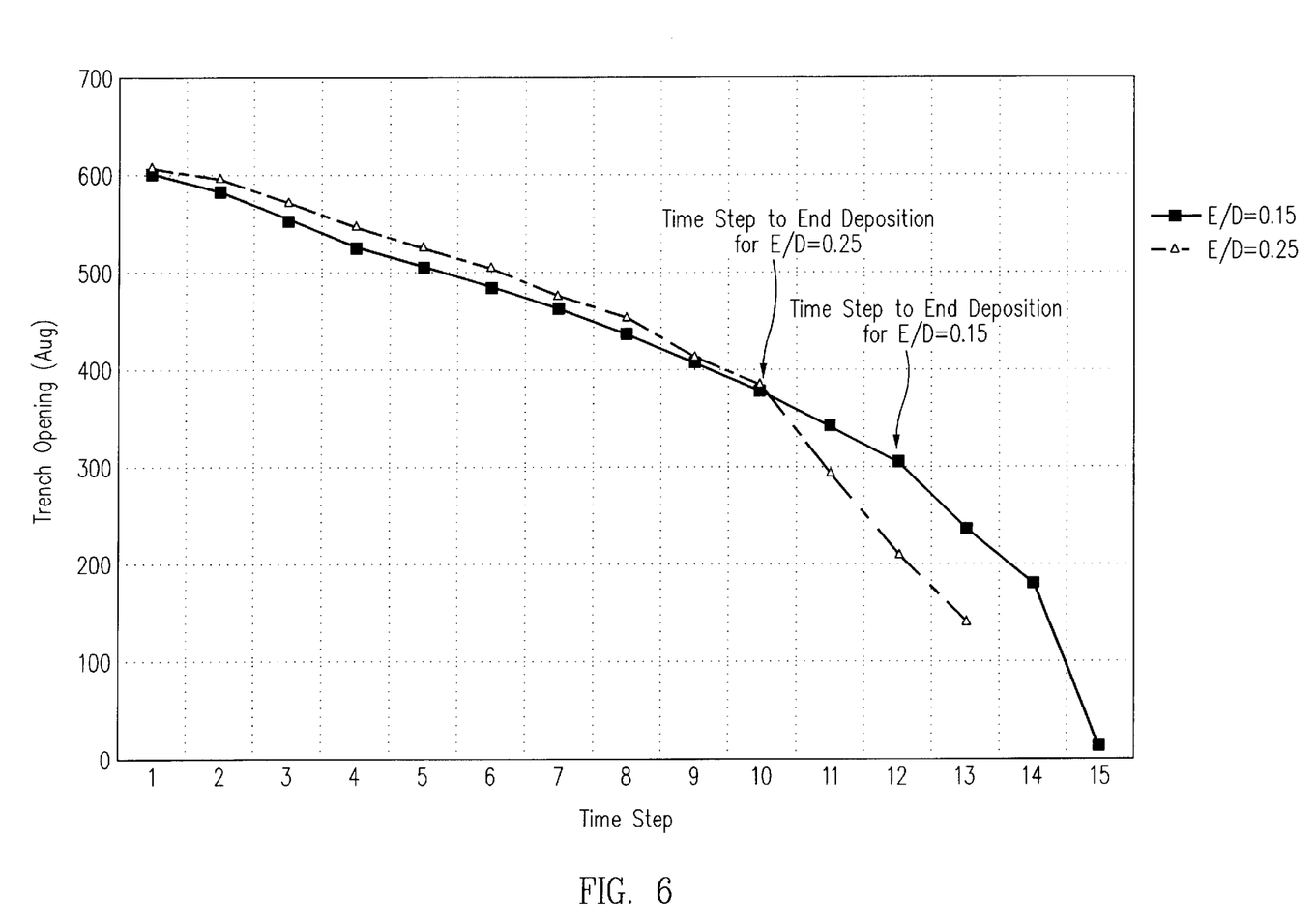
FIG. 6 is a graph showing the size of a gap opening as a function of the duration of a deposition step for two different etch/dep ratios.
Figure 7A:
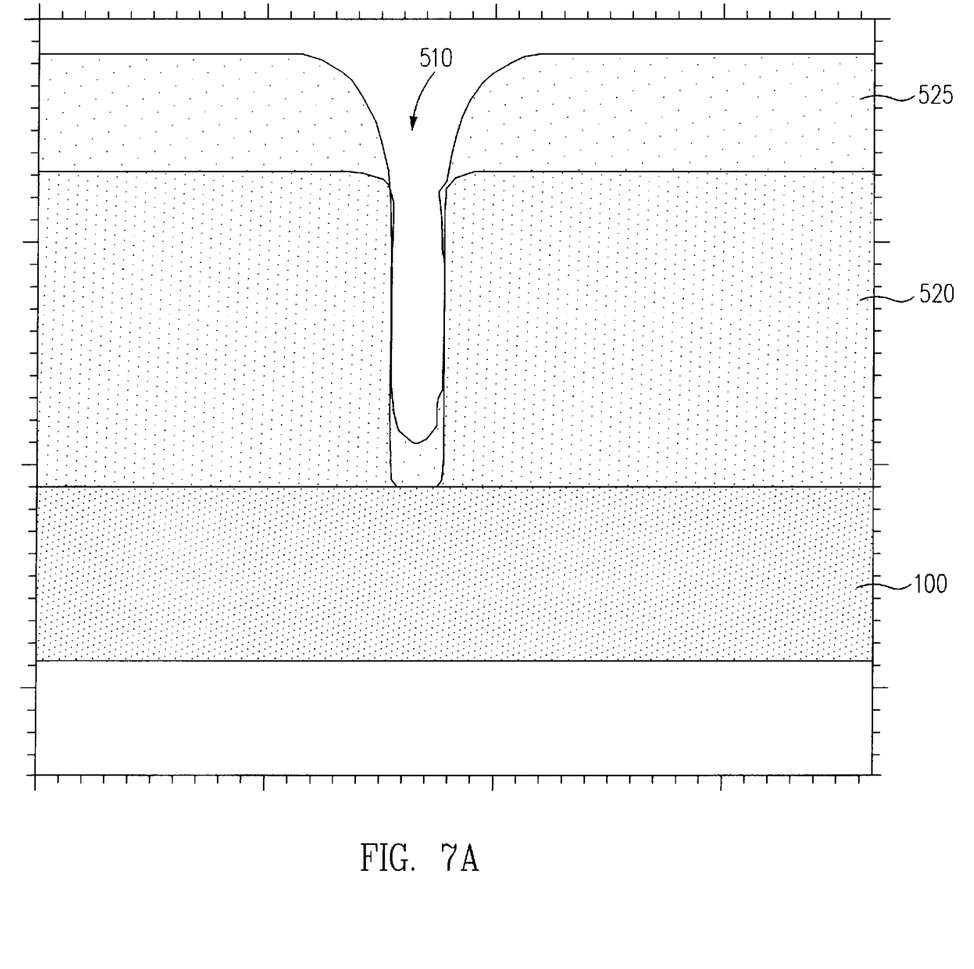
FIGS. 7A–7C are simulation-derived deposition profiles of high aspect ratio gaps after a deposition/etching cycle of the present invention for three different durations of a deposition step of FIG. 6 with etch/dep ratio equal to 0.15.
Figure 7B:
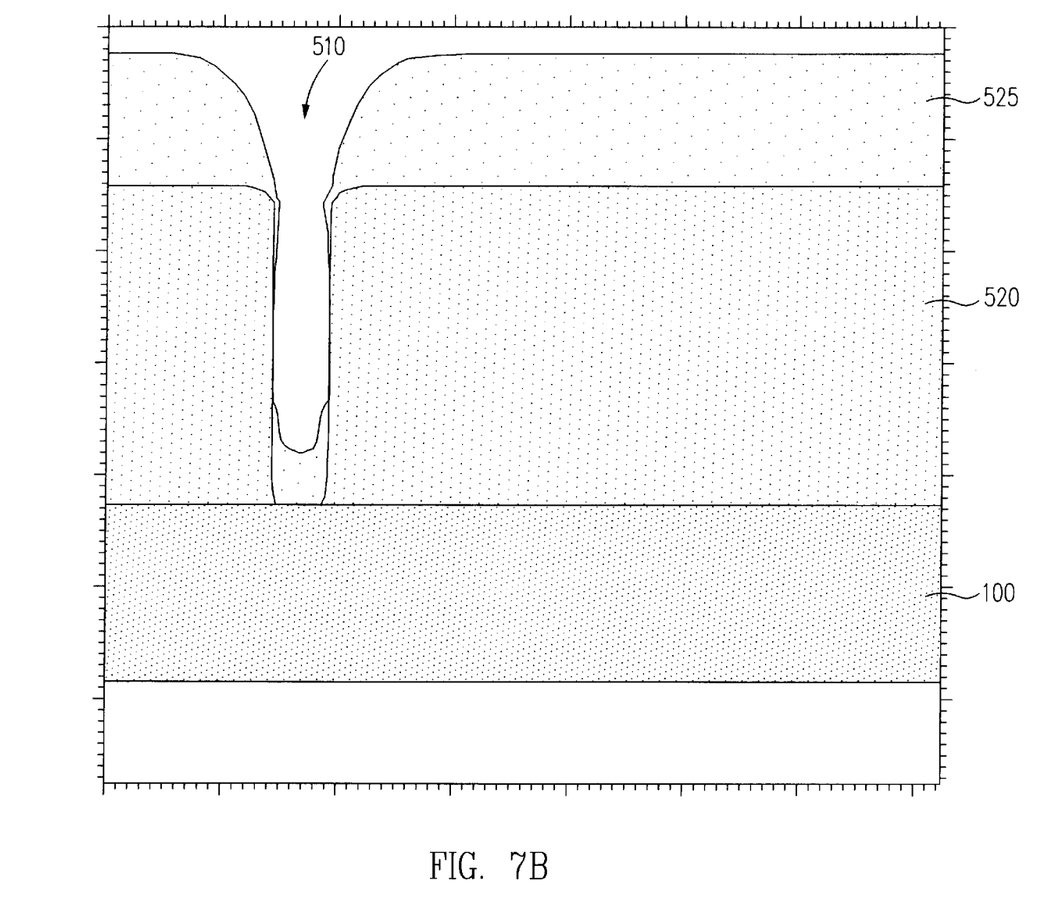
Figure 7C:
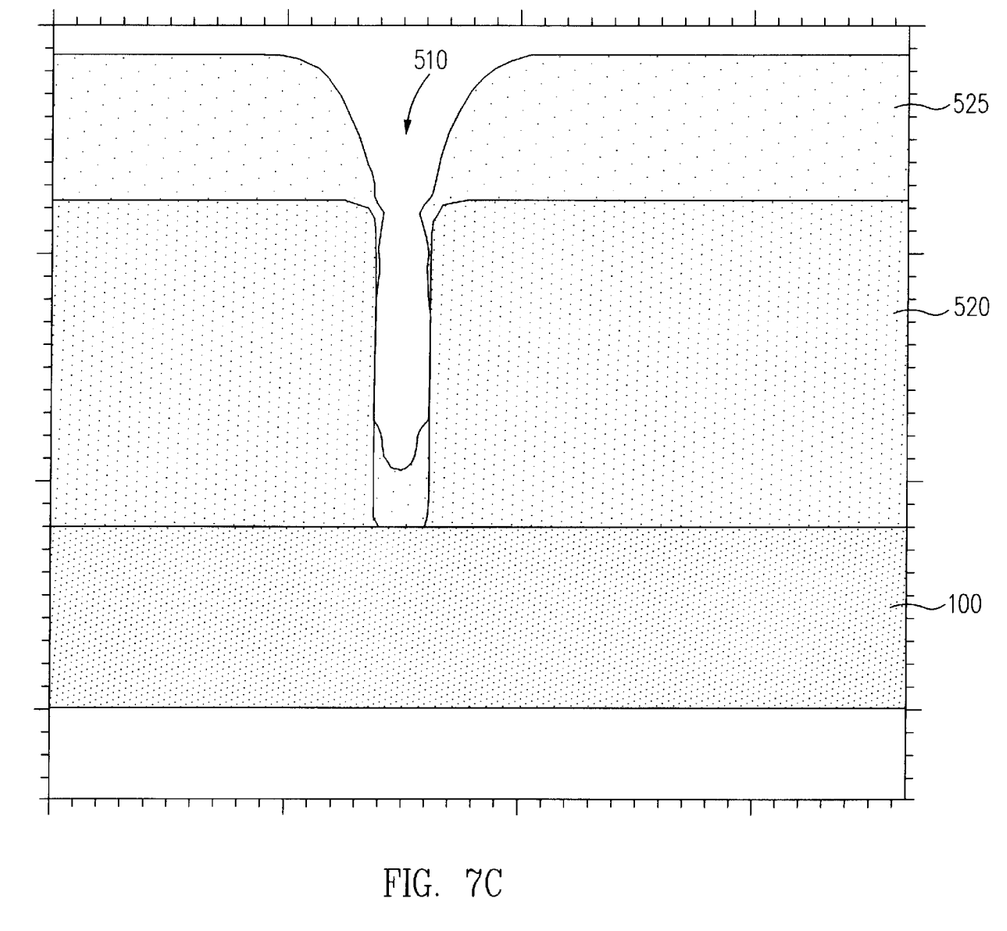

FIGS. 6 and 7A–7C illustrate the need for optimizing the duration of deposition steps. FIG. 6 is a simulation-derived graph showing the trench opening of a gap of initial aspect ratio 6:1 and initial width 0.06 μm or 600 Å as a function of the duration of deposition steps with etch/dep ratios of 0.25 (shown as the dashed line) and 0.15 (shown as the solid line). The duration of a deposition step increases with increasing time steps, e.g., at time step 8, the duration of the deposition step is twice that at time step 4, where the time step units are arbitrary. FIGS. 7A–C show the simulated deposit profile after a deposition-etching cycle performed on the same structure. In all three cases (FIGS. 7A–C) the processes used for the deposition and etching cycle were identical, and the etch/dep ratio of the deposition process was equal to 0.15 (referring to FIG. 6). In FIG. 7A the deposition step was interrupted after time step 14 of FIG. 6, in FIG. 7B after time step 13, and in FIG. 7C after time step 12. The aspect ratio of the feature, defined as ratio of the height of the remaining gap to the width of the narrowest opening in the remaining gap, increases after the deposition/etching cycle from approximately 5.3:1 in FIG. 7A to approximately 6.2:1 in FIG. 7B to approximately 7.5:1 in FIG. 7C.

As can be seen in FIGS. 7A–C, terminating the deposition process at time step 12 of FIG. 6 yields a structure with maximum opening and minimum aspect ratio at the end of the deposition-etching cycle. Terminating the deposition step at time step 14 of FIG. 6 will yield a structure of aspect ratio 7.5:1. It is evident, therefore, that terminating the deposition past the optimum point in time will ultimately make impossible to achieve void-free gap-fill, as the aspect ratio of the structure will be progressively increasing. On the other hand, if the process is terminated before time step 12, the overall throughput will be lower than its maximum possible value, since a higher number of deposition-etch cycles will be needed in order to fill the trench. Based on our simulation results, the deposition step should be terminated before the entry to the gap is narrowed to 40% of the initial entry opening. As entry gap region we define the narrowest point of the path the ions should travel to impinge on the film surface growing perpendicularly to the bottom of the feature. The specific duration of the deposition step depends on both the geometry of the feature (width and aspect ratio) and the HDP process used to fill the gap. For example, in FIG. 6, the deposition step for an etch/dep ratio of 0.25 is stopped earlier in time (time step 10) than the deposition step for an etch/dep ratio of 0.15 (time step 12).

The etch/dep ratio of the etch steps is optimized based on the geometry of the structure and the topography of the cusp or overhang. The duration of the etch steps is determined by the rate of material removal. Data from simulations and experiments on both monitor (flat) and structured wafers can be used to optimize the etch/dep ratio and/or the etch step duration for each etch step in a gap-fill process.

Table 2 provides typical process parameter ranges during an etch step for undoped silica glass deposition. For the etch step, the rate of etching must predominate over any deposition which occurs. Therefore, an etch/dep ratio of 50:1 or greater is preferred. The gas mixture for the etch step includes oxygen, a low atomic weight inert gas, e.g., He or Ne, but not Ar or heavier atomic weight gases, a reactive etch gas, and silane. This mixture will provide a non-fully directional etch in order to prevent corner clipping. The reactive etch gas can be $NF_3$, $SF_6$, or a fluorocarbon, such as $CF_4$ and $C_2F_6$. Unlike the conventional oxide etch steps described in the articles by Cote et al., Pennington et al., and U.S. Pat. No. 5,270,264, Ar or heavier inert gases, such as Kr and Xe, are not included in the etch mixture in order to achieve better process control through lower etching rates, and avoid clipping the corners of the underlying structure. During the etch steps, the LF power varies from 1–10 kW and the HF power varies from 0.1–5 kW, depending on wafer size (e.g., 200 or 300 mm diameter) and the specific process requirements.

Optimum process results are obtained when the etching is not fully directional, i.e., etching does not occur only in the vertical direction as in the processes described in the articles by Cote et al., Pennington et al., and U.S. Pat. No. 5,270,264. Fully directional etching is undesirable because the process of removing cusps from the gap opening can result in the erosion of features which are located at the corners of the gaps to be filled, i.e. "corner clipping." For example, in FIG. 2A, in order to remove cusps 210, the etch step, if fully directional, would have to remove an amount of material equal to the vertical height of the cusps. However, the etch step would then also etch away a part of the corner of element 120. When the etch step is not fully directional (i.e., isotropic or partially isotropic), etching occurs in the horizontal directional as well, so that cusps can be removed without clipping the corners of the elements. Thus, the range of operating pressures and the power levels used in the etching steps are chosen to satisfy this requirement. Wafer temperature can be modulated either by clamping the wafer on the electrostatic chuck (ESC) and cooling the wafer using He or by using a heated ESC.

TABLE 2

| PROCESS PARAMETER | RANGE |
| --- | --- |
| Low Frequency Power (kW) | 4–10 |
| High Frequency Power (kW) | 0.1–5 |
| Chamber Pressure (mTorr) | 5–65 |
| Etch Step Duration (s) | 5–700 |
| Oxygen Flow Rate (sccm) | 10–1000 |
| Inert Gas Flow Rate (sccm) | 10–1000 |
| Reactive Etch Gas Flow Rate (sccm) | 0–500 |
| Silane Flow Rate (sccm) | 0–60 |

The deposition and etch steps are preferably carried out in the same process chamber, such as the Novellus SPEED reactor, and transitions from a deposition to an etching step are effected by varying the composition of the mixture, the power supplied to the wafer, the chamber pressure, and/or the temperature of the wafer. Therefore, a higher throughput is possible than with processes using cluster tools, as in the processes described in the articles by Cote et al., Pennington et al. and U.S. Pat. No. 5,270,264, i.e. having separate deposition and etching chambers because the wafer does not need to be transferred back and forth between two separate chambers. By optimizing the etch/dep ratio and duration of each step, gap-fill capability and throughput can be maximized, and features with aspect ratios approaching and exceeding 5:1 and initial opening widths narrower than approximately 0.15 μm can be filled without void formation, even when they are reentrant.

Tables 3 and 4 below contain a listing of the process parameters for the deposition, and the etching steps, respectively, for filling a gap having a critical dimension (initial opening width in the substrate surface) of 0.15 μm and an aspect ratio of about 6.0. The process parameters are indicated for a wafer of 200 mm diameter. "Dopant" refers to dopant gases such as phosphine $PH_3$, diborane $B_2H_6$, and arsine $AsH_3$, which can be used when a silica glass film is deposited. In such case, a dopant gas flow rate between about 10 to 250 sccm is used. When undoped silica glass is to be deposited, the dopant gas flow rate is set to zero.

TABLE 3

Deposition process parameters for a 200 mm wafer.

| PROCESS PARAMETER | RANGE |
| --- | --- |
| Low Frequency Power (kW) | 3–5 |
| High Frequency Power (kW) | 0.5–5 |
| Chamber Pressure (mTorr) | 1.5–25 |
| Deposition Step Duration (s) | 5–500 |
| Oxygen Flow Rate (sccm) | 30–500 |
| Inert Gas Flow Rate (sccm) | 10–600 |
| Silane Flow Rate (sccm) | 30–170 |
| Dopant Flow Rate (sccm) | 0–250 |

TABLE 4

Etch step process parameters for the same case.

| PROCESS PARAMETER | RANGE |
| --- | --- |
| Low Frequency Power (kW) | 4–5 |
| High Frequency Power (kW) | 0.2–1.5 |
| Chamber Pressure (mTorr) | 10–65 |
| Etch Step Duration (s) | 20–200 |
| Oxygen Flow Rate (sccm) | 100–700 |
| Inert Gas Flow Rate (sccm) | 100–1000 |
| Reactive Etch Gas Flow Rate (sccm) | 0–300 |
| Silane Flow Rate (sccm) | 0–30 |

The above-described embodiments of the present invention are meant to be merely illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A process, in integrated circuit production, for filling a gap having an opening of initial width in the surface of a substrate, comprising the steps of:

first depositing a film in said gap using an HDP CVD process having an etch/dep ratio greater than about 0.02;

stopping said first depositing before said opening closes;

etching said film in said gap;

stopping said etching before corners of elements forming said gap are exposed; and later depositing a film in said gap.

2. The process of claim 1, wherein said step of first depositing is stopped when said opening is no less than about 40% of said initial width.

3. The process of claim 1, wherein said etch/dep ratio of said step of depositing is less than or equal to approximately 0.25.

4. The process of claim 1, wherein said step of depositing is performed with a gas mixture comprising oxygen, silane, and an inert gas.

5. The process of claim 4, wherein said inert gas for said step of depositing is argon, neon, or helium.

6. The process of claim 1, further comprising repeating one or more cycles of said step of first depositing and said step of etching until said gap is filled without leaving a void in said gap.

7. The process of claim 1 wherein said film is undoped silica glass.

8. The process of claim 1 wherein said film is doped silica glass.

9. The process of claim 8 wherein said step of first depositing is performed with a dopant gas comprising a gas selected from the group consisting of phosphine ($PH_3$), diborane ($B_2H_6$), and arsine ($AsH_3$).

10. The process of claim 1, wherein said substrate is attached to and heated or cooled by a thermally controllable electrostatic chuck.

11. The process of claim 10 wherein said electrostatic chuck is resistively heated.

12. The process of claim 10 wherein said substrate attached to said electrostatic chuck is cooled with backside flow of helium.

13. The process of claim 1 wherein said step of etching is performed simultaneously with a second deposition, such that said step of etching is performed with an etch/dep ratio of greater than one.

14. The process of claim 13 wherein said step of etching is performed with an etch/dep ratio greater than about 50.

15. The process of claim 1 wherein said step of etching is performed by sputter etching.

16. The process of claim 1 wherein said step of etching is performed by a non-fully directional etching process.

17. The process of claim 1 wherein said step of etching is performed with a gas mixture comprising an inert gas having an atomic weight lower than that of argon.

18. The process of claim 17 wherein said gas mixture for said step of etching further comprises a reactive etch gas.

19. The process of claim 17 wherein said gas mixture for said step of etching further comprises oxygen.

20. The process of claim 17 wherein said gas mixture for said step of etching further comprises silane.

21. The process of claim 20 wherein said step of depositing is performed with a gas mixture comprising an inert gas, oxygen, and silane.

22. The process of claim 1 wherein said step of etching is performed in situ.

23. The process of claim 1 wherein said step of first depositing and said step of etching are performed in a single process chamber.

24. A process, in integrated circuit production, for depositing an oxide film to fill a gap having an opening of initial width in the surface of a substrate of a less than or equal to about 0.15 microns and a depth, wherein the ratio of said depth to said initial width defines a high aspect ratio of about 5:1 or greater, said process comprising the steps of:

first depositing an oxide film in said gap using an HDP CVD process having an etch/dep ratio between about 0.02 and about 0.25;

stopping said first depositing when said opening is narrowed to no less than about 40% of said initial width;

etching, in situ, said oxide film in said gap with an HDP etching process;

stopping said etching before corners of elements forming said gap are exposed; and later depositing an oxide film in said gap.

25. The process of claim 24 wherein said step of etching is performed with a gas mixture comprising an inert gas having an atomic weight lower than that of argon.

26. The process of claim 24 wherein said step of etching is performed with a reactive etch gas.

27. The process of claim 26 wherein said gas mixture for said step of etching comprises oxygen.

28. The process of claim 24 wherein said step of depositing is performed with a dopant gas comprising a gas selected from the group consisting of phosphine ($PH_3$), diborane ($B_2H_6$), and arsine ($AsH_3$).

29. The process of claim 24 wherein said step of etching is performed simultaneously with a second deposition such that said step of etching is performed with an etch/dep ratio greater than about 50.

30. The process of claim 24 wherein said step of etching is performed by sputter etching.

31. The process of claim 24 wherein said step of etching is performed with a non-fully directional etch process.

32. The process of claim 24 wherein said gas mixture for said step of etching further comprises silane.

33. The process of claim 32 wherein said depositing is performed with a gas mixture comprising an inert gas, oxygen, and silane.

34. The process of claim 24 wherein said step of first depositing and said step of etching are performed in a single process chamber.

* * * * *